United States Patent
Fujii

(10) Patent No.: US 11,094,552 B2
(45) Date of Patent: Aug. 17, 2021

(54) METHOD FOR ETCHING RECESSED STRUCTURES

(71) Applicant: MURATA MANUFACTURING CO., LTD., Nagaokakyo (JP)

(72) Inventor: Hidetoshi Fujii, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/675,951

(22) Filed: Nov. 6, 2019

(65) Prior Publication Data
US 2020/0168465 A1    May 28, 2020

(30) Foreign Application Priority Data
Nov. 23, 2018  (FI) .................................... 20185992

(51) Int. Cl.
    *H01L 21/308* (2006.01)
    *H01L 21/306* (2006.01)

(52) U.S. Cl.
    CPC .... *H01L 21/3081* (2013.01); *H01L 21/30608* (2013.01)

(58) Field of Classification Search
    CPC .................. H01L 21/3081; H01L 21/30608
    See application file for complete search history.

(56) References Cited

U.S. PATENT DOCUMENTS

| 6,612,029 B2 | 9/2003 | Behin et al. |
| 2003/0066816 A1 | 4/2003 | Schultz et al. |
| 2003/0123124 A1 | 7/2003 | Abu-Ageel |
| 2010/0326191 A1 | 12/2010 | Foster et al. |

FOREIGN PATENT DOCUMENTS

| EP | 2267461 A1 | 12/2010 |
| JP | 2011-17699 A | 1/2011 |
| KR | 10-2007-0106358 A | 11/2007 |
| WO | WO 2016/185312 A1 | 11/2016 |

OTHER PUBLICATIONS

Finnish Search Report dated Jun. 19, 2019 corresponding to Finnish Patent Application No. 20185992.
Mar. 16, 2020 Search Report issued in European Patent Application No. 19206693.

*Primary Examiner* — Errol V Fernandes
(74) *Attorney, Agent, or Firm* — Squire Patton Boggs (US) LLP

(57) ABSTRACT

A method for manufacturing recessed micromechanical structures in a wafer. A first etching mask and a second etching mask are patterned on the horizontal face of the wafer. The second etching mask defines at least one recess area and the first etching mask defines at least one etch-control area within the at least one recess area. The placement, number and dimensions of the etch-control areas influence the vertical etch rate of the recessed structure. Adjacent structures can be etched to different recess depths by selecting suitable etch-control areas.

10 Claims, 8 Drawing Sheets

METHOD FOR ETCHING RECESSED STRUCTURES

FIELD OF THE DISCLOSURE

The present disclosure relates to micromechanical devices, and more particularly to etching methods for manufacturing micromechanical device layers in a device wafer.

BACKGROUND OF THE DISCLOSURE

Microelectromechanical (MEMS) systems often comprise micromechanical parts formed in the structural layer of a device wafer by etching. Micromechanical parts with suitable dimensions can form partly mobile structures supported by the surrounding parts of the structural layer. MEMS systems which comprise partly mobile micromechanical structures include, for example, acceleration sensors, gyroscopes, micromirrors, optical switches and scanners.

Irregularities in patterned micromechanical structures can introduce measurement errors or cause short-circuits which entirely prevent measurement or actuation in the MEMS device. Accurate etching is therefore an important part of MEMS manufacturing processes.

This disclosure relates to etching of structural layers which contain recessed micromechanical structures. The meaning of the term "recessed" is illustrated in FIG. 1. FIG. 1 shows a cross-section of a structural layer 11. The layer extends beyond the edges of the figure. Four micromechanical structures 12-15 are depicted in the middle of the figure.

The structural layer 11 has a first horizontal face 111 and a second horizontal face 112. The horizontal faces 111 and 112 define two xy-planes, and the vertical z-direction is perpendicular to these planes. The micromechanical structures 12-15 extend in the positive or negative y-direction, away from the xz-plane shown in FIG. 1. The micromechanical structures may be attached to an inertial mass or to a fixed support at attachment points which are not illustrated in the cross-section shown in FIG. 1.

As seen in FIG. 1, the micromechanical structures 12-15 do not all have the same vertical height as the structural layer in the z-direction, and their vertical heights are not equal. For the purposes of this disclosure, the following terminology will be adopted. Micromechanical structure 12 is a level structure with regard to first horizontal face 111. It is also a level structure with regard to second horizontal face 112. Micromechanical structure 13 is a recessed structure with regard to first horizontal face 111 and a level structure with regard to second horizontal face 112. Micromechanical structure 14 is a level structure with regard to first horizontal face 111 and a recessed structure with regard to second horizontal face 112. Micromechanical structure 15 is a recessed structure with regard to first horizontal face 111 and also a recessed structure with regard to second horizontal face 112.

In other words, a micromechanical structure is level with regard to a horizontal face of the structural if it extends in the vertical direction to the xy-plane defined by that face. A micromechanical structure is recessed with regard to a horizontal face of the structural layer if it does not extend to the xy-plane defined by that face. A recession depth D, defined as the vertical distance from a horizontal face to the closest edge of the micromechanical structure, can be defined for each recessed structure. The recession depth D of micromechanical structure 13 with respect to horizontal face 111 is illustrated in FIG. 1.

Recessing closely spaced high aspect ratio (HAR) micromechanical structures requires at least two steps: a first deep etching step where the dimensions of the micromechanical structures are defined with deep trenches (which may go all the way through the structural layer); and then a second deep etching step where the recessed structures are etched to their desired recess depth. The second deep etch may be either an isotropic or an anisotropic etching process.

If micromechanical structures in the same structural layer are to be recessed to several different recess depths, separate masks may be used for each level and the number of mask removal and deep etching steps may be increased so that they equal the number of recess levels. However, it would greatly simplify recess etching to multiple levels if additional masks and additional mask removal and deep etching steps would not be needed for obtaining structures etched to multiple recess levels.

BRIEF DESCRIPTION OF THE DISCLOSURE

An object of the present disclosure is to provide a method which overcomes the above problems.

The objects of the disclosure are achieved by a method which is characterized by what is stated in the independent claims. The preferred embodiments are disclosed in the dependent claims.

The disclosure is based on two ideas: the first is to protect the vertical sidewalls formed in a first deep etch with a self-supporting etching mask before the second deep etching step. The portions of the self-supporting etching mask which have been deposited on the micromechanical structures to be recessed become partly free-standing vertical walls as the second deep etching step proceeds.

The second idea is to form etch-control areas which extend at regular intervals from a self-supporting vertical mask on one side of a recess area to a self-supporting vertical mas on another side of the recess area. The width and spacing of these etch-control areas influence the vertical etch rate in the second deep etching step. The recess depth on a given area can thereby be controlled by changing the geometry of the etch-control areas. Recess areas with different geometries can therefore be etched simultaneously to different recess depths.

An advantage of the method presented in this disclosure is that micromechanical structures in the same structural layer can be simultaneously recessed to multiple recess depths without using a separate mask for defining each recess area.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
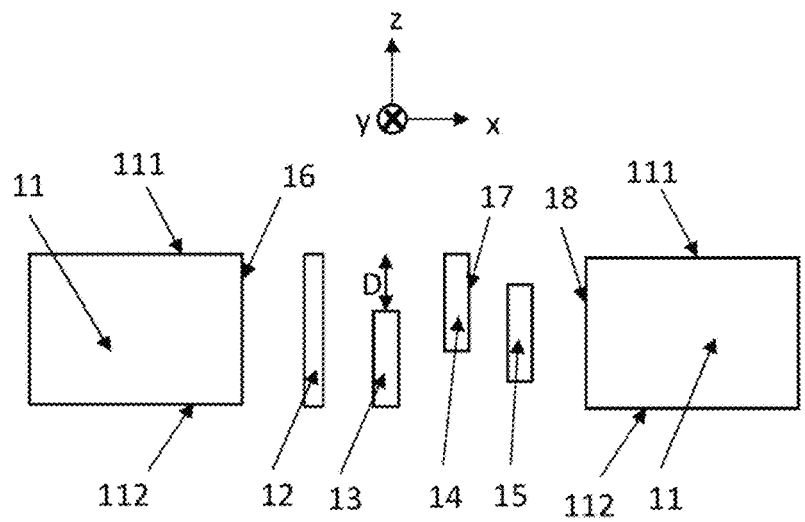
FIG. 1 illustrates a cross-section of a structural layer with recessed structures.

This disclosure describes a method for manufacturing micromechanical structures in a structural layer of a wafer. The manufactured structures include at least one recess area where the micromechanical structures are vertically recessed in relation to a horizontal face of the structural layer. The method comprises the following steps a-e:
a) depositing and patterning a first etching mask and a second etching mask on the horizontal face of the structural layer, wherein the first etching mask is deposited before the second etching mask, and the second etching mask defines at least one recess area which corresponds to at least one structure which is to be vertically recessed, and the first etching mask defines at least one etch-control area within the at last one recess area, so that each etch-control area is separated from other etch-control areas and extends across the at least one recess area, from one side of said recess area to another side of said recess area,
b) etching first vertical trenches by anisotropic etching in regions of the structural layer which are not protected by the first etching mask or by the second etching mask,
c) removing the second etching mask from the horizontal face of the structural layer, so that the at least one recess area, and the at least one etch-control area which extends across the at least one recess area, are exposed,
d) depositing at least on the vertical sidewalls of the first vertical trenches a self-supporting etching mask, so that the vertical walls formed by the self-supporting etching mask follow the perimeter of the at least one recess area and the at least one etch-control area formed by the first etching mask covers a part of the at least one recess area by extending from a part of the self-supporting mask which lies on one side of said recess area to a part of the self-supporting etching mask which lies on another side of said recess area,
e) etching second vertical trenches by isotropic etching in the at least one recess area.

For the purposes of this disclosure, it will be assumed that each recess area has a rectangular or trapezoidal shape. The x-direction will be called the transversal direction and the y-direction will be called the lateral direction. The recess area could alternatively have a triangular shape or a more complex shape. The etching principles described in this disclosure are applicable to recess areas of all shapes.

The number of recess areas may be one, if only one recessed structure is to be formed. On the other hand, the number of recess areas may be several thousand, for example in applications where a large number of finger-shaped electrodes are to be recessed in the structural layer and each finger forms its own recess area. Each recess area has its own set of etch-control areas, and the geometry of these etch-control areas in said recess area may determine the vertical etching rate in that recess area in the second deep etching step (step e). Different recess areas may have differently placed etch-control areas, as described below.

In the following presentation, the term "first etching mask" refers to an etching mask which may define two kinds of horizontal areas: level areas which are not to be recessed at all, and etch-control areas whose geometry influences the etch rate and etch depth in the recess areas. The level areas may for example include the supporting areas of the structural layer which support and surround the recessed micromechanical structures. In other words, in addition to defining etch-control areas, the first etching mask may protect the broad areas of the structural layer which are intended to be unaffected by the recess etching. The first etching mask may therefore be kept in place for the entire duration of the recess etching process.

The term "second etching mask", on the other hand, refers to an etching mask which defines only the horizontal areas which are to be recessed, i.e. the recess areas. When the second etching mask is deposited, it may cover parts of the first etching mask, such as the etch-control areas. In areas where the horizontal surface of the structural layer is to be recessed, this overlap of the second etching mask with the etch-control areas of the first etching mask allows the etch-control areas to influence the vertical etch rate within the recess areas defined by the second etching mask.

In this disclosure, the term "horizontal" refers to a plane which is parallel to one face of the device wafer, or one face of the structural layer. The horizontal plane which corresponds to the top surface of the device wafer is indicated as the xy-plane in the figures. The term "vertical" refers to the direction which is perpendicular to horizontal planes, and it is indicated as the z-axis in the figures.

Terms such as "vertical" and "horizontal" do not imply anything about the orientation of the wafer when the MEMS device is manufactured, or when the device is in use. The device and the substrate may be oriented in any suitable direction during usage and manufacturing, for example sideways in such a manner that a plane which is in this disclosure referred to as "horizontal" becomes a vertical plane. In other words, the terms "horizontal" and "vertical" merely define two orthogonal directions, one of which is parallel to a substrate surface or wafer surface, and the other of which is normal to that surface.

Figure 2A:
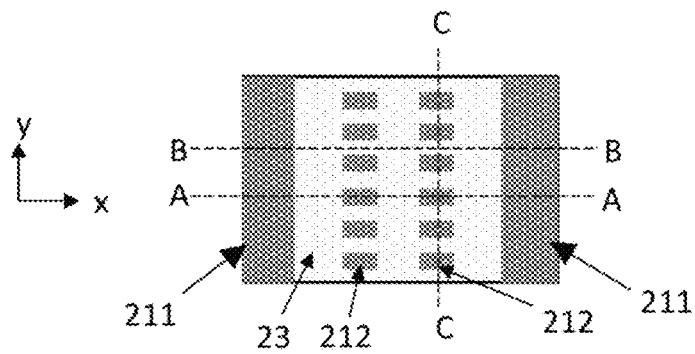
FIGS. 2a-2d illustrate an example of first and second etching mask geometries and the associated etching process.
Figure 2B:
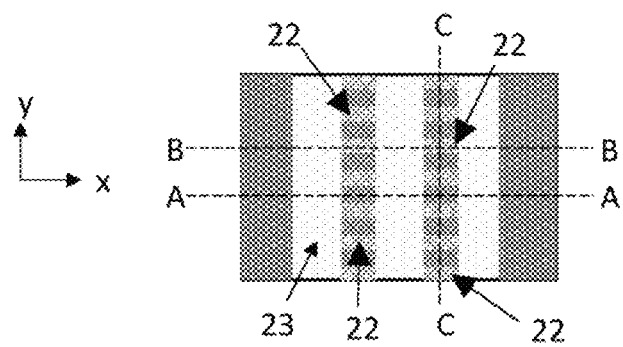

FIGS. 2a-2b illustrate an example of first and second etching mask geometries. Only regions which are necessary for explaining the recess etching process are illustrated in these figures. Other regions of the micromechanical structures, for example regions that contain springs which render some structures partly mobile, are not illustrated in the figures.

FIG. 2a illustrates a part of a horizontal face of a structural layer 23 before etching. A first etching mask 211/212 has been deposited and patterned on this horizontal face. The first etching mask incudes areas 211 where the structural layer will remain level throughout the etching process. The first etching mask also includes areas 212, which will serve as etch-control areas in subsequent steps of the etching process. Two lines A-A and B-B are illustrated in FIG. 2a. Corresponding cross-sections are illustrated below in FIGS. 2c and 2d, respectively. The placement, number and dimensions of the etch-control areas influence the vertical etch rate of the structure which is to be recessed in the second deep etch.

FIG. 2b illustrates the same part of the horizontal face of the structural layer 23 after a second etching mask 22 has been deposited. This second etching mask defines the recess areas where a recessed micromechanical structure is to be created. As seen in the figure, the recess areas defined by second etching mask 22 cover the etch-control areas 212 defined by the first etching mask. In the illustrated case, each etch control area 212 (visible as a shadowed area below the second etching mask 22) is contained within a recess area and forms a bridge which extends across a recess area.

The etch control areas 212 in FIGS. 2a and 2b form a row of evenly spaced bridges which extend from one side of a recess area to another. Etch-control areas can also have different shapes and be positioned in a different manner, but the masking and etching steps still occur in the same order. Alternative etch-control geometries will be discussed in detail below.

Figures 2C, 2D:
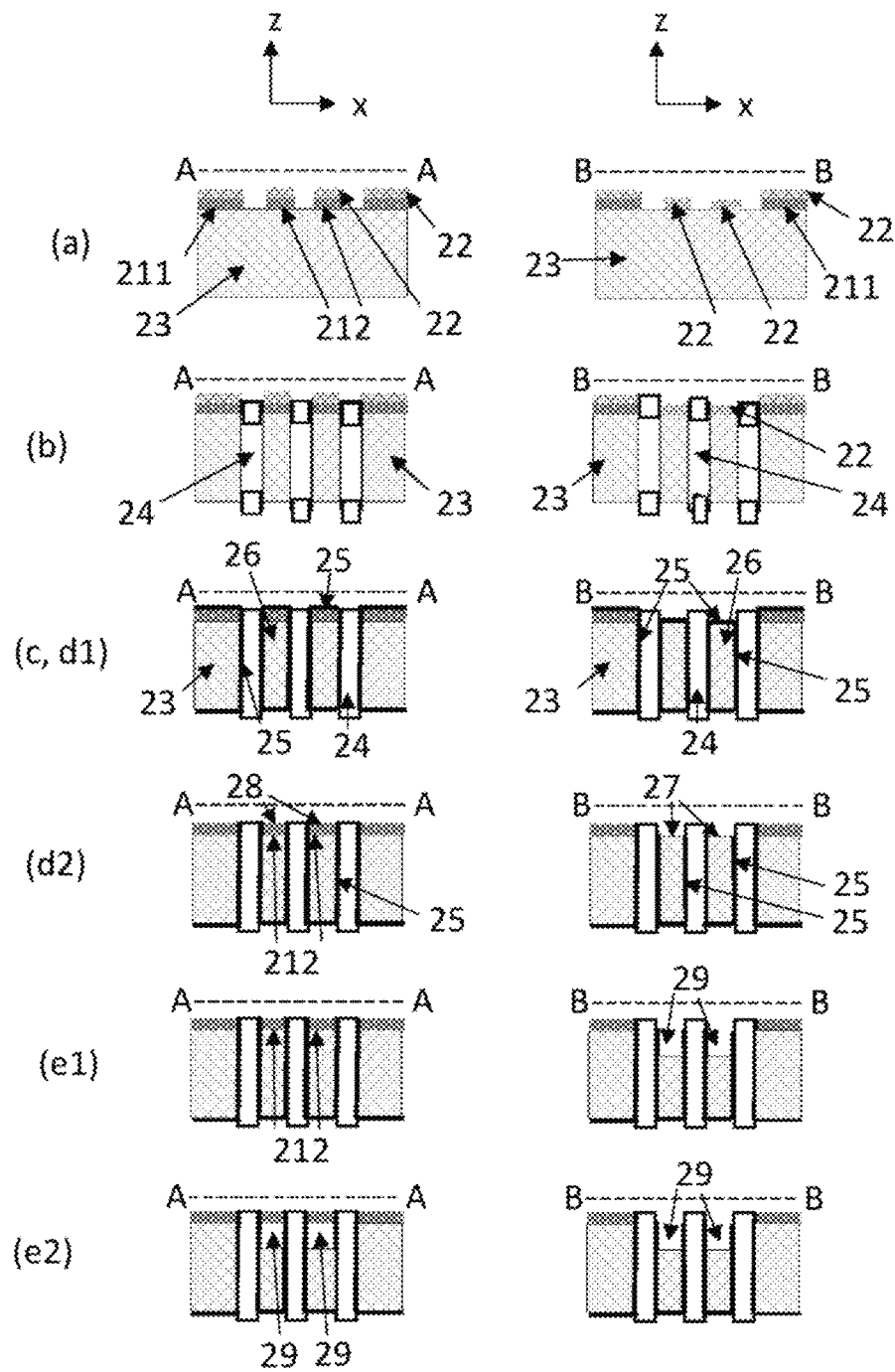

FIGS. 2c and 2d illustrate the etching process. Both Figures illustrate the same etching sequence performed on the device shown in FIG. 2b, but FIG. 2c shows a vertical cross section along the line A-A in FIGS. 2a and 2b, and FIG. 2d shows a vertical cross section along the line B-B in FIGS. 2a and 2b. Process steps are labelled (a)-(e) on the left so that steps (d) and (e) have each been subdivided into two steps; (d1)+(d2) and (e1)+(e2), respectively. Consequently, a situation which is illustrated at a given step in FIG. 2c occurs simultaneously as the adjacent situation illustrated in FIG. 2d.

Process step (a) illustrates the A-A and B-B cross-sections in the initial state shown in FIG. 2b, where first and second masks have been deposited but no etching has yet taken place. In the A-A cross-section, the second etching mask (22) covers the first etching mask in both areas 211 and 212. In the B-B cross-section, the second etching mask (22) covers the first etching mask (211) in the regions which are to remain level, but in the recess areas the second etching mask lies directly on the structural layer 23.

Process step (b) illustrates the A-A and B-B cross-sections when a first deep etch has been performed on the top surface of the device shown in step (a). The resulting first vertical trenches 24 extend in this case all the way through the device wafer, but it is also possible to etch the first vertical trenches only partly through the structural layer and to complete the etching of the first vertical trenches in the second deep etch. The first deep etch may be an anisotropic deep-reactive ion etch (DRIE) process performed on the horizontal face (top surface) of the structural layer. This DRIE may remove some of the first or second etching mask materials, so the first and second etching masks should be made sufficiently thick to withstand this removal.

In process step (c, d1), the second etching mask 22 has been removed from the top surface of the structural layer 23 to open the recess areas for etching. Before the second deep etch is started, at least the vertical sidewalls of the first vertical trenches 24 are covered with a self-supporting etching mask 25, which has been drawn as a thick black line on these surfaces in step (c, d1). The self-supporting etching mask is needed only on the sidewalls of the first vertical trenches 24, but it may in some cases not be possible to deposit the self-supporting material only on these sidewalls. The self-supporting etching mask may therefore also cover the top surface of the structural layer 23, and possibly the bottom surface as well, as indicated in the figure.

The material of the self-supporting etching mask material is chosen so that the self-supporting etching mask becomes self-supporting when deposited to a sufficient thickness. In this disclosure, the term "self-supporting" means that when the mask is deposited on a vertical sidewall, the mask becomes sufficiently rigid to remain vertically standing even as the sidewall upon which it was originally deposited is etched away.

In other words, the micromechanical structure 26 may form an initial vertical sidewall on which the self-supporting etching mask material is deposited. When this micromechanical structure is gradually recessed in a second deep etch where a part of the vertical sidewall is removed, the self-supporting etching mask still remains vertically standing in the location where the vertical sidewall stood.

The top edges of the vertical walls formed by the self-supporting etching mask can thereby follow the perimeter of the recess area (defined by the second etching mask 22) in the xy-plane even as the micromechanical structure within the recess area is gradually etched away below the xy-plane. As explained in more detail below, etch-control areas may cover a part of a recess area for example by extending across the recess area or by forming a frame around the recess area. In either case, the parts of the first etching mask which form the etch-control areas extend between self-supporting walls on opposing or partly opposing sides of the recess area.

The vertical etch rate of a micromechanical structure in a rectangular recess area depends primarily on its most narrow dimension, which in the case of micromechanical structure 26 is the finger width in the x-direction. This width-dependent vertical etch rate can now be selectively controlled by altering the geometry of the etch-control areas. The etch-control areas remain attached to the top edges of the vertical walls formed by the self-supporting mask even as the second vertical trenches are etched, as step (e2) in FIG. 2c illustrates. This will be described in more detail below.

The self-supporting etching mask material may, for example, be silicon dioxide, and it may for example be deposited in a chemical vapour deposition process where tetraethylorthosilicate (TEOS) is used as a precursor. Alternatively, the self-supporting etching mask material may be silicon dioxide or silicon nitride, deposited in a chemical vapour deposition process or spin-on-glass process. The material of the self-supporting etching mask may also be a metallic material such as aluminium, deposited in a PVD process. Other alternatives include polymers such as polyimide, or photoresists, deposited by vapour deposition or spray coating.

The thickness required of the self-supporting etching mask material for forming a self-supporting wall depends on the material which is used, but it may, for example, be in the range 0.1 μm-10 μm. Thick self-supporting etching masks may be needed if they will be required to carry the weight of extensive etch-control areas.

The horizontal widths of micromechanical structures 26, which correspond to the distances between the sidewalls where the self-supporting etching mask material is deposited, may be as low as 0.1 μm. The horizontal widths of the first vertical trenches 24 may be as low as 0.3 μm, but they may also be very much larger, since micromechanical structures may be located next to large open areas.

Step (d2) is an optional step which is needed only if the self-supporting etching mask covers the horizontal face of the structural layer (in addition to covering the vertical sidewalls). The self-supporting etchings mask is in this step removed from the horizontal face of the structural layer before the second deep etch can begin. The figures in step (d2) illustrate the A-A and B-B cross-sections when the self-supporting etching mask 25 has been removed from the horizontal surfaces of the structural layer 23. This removal may for example be performed with a dry etching process performed on the first horizontal face of the structural layer.

The self-supporting etching mask material is thereby removed from the horizontal surfaces which face in the same direction as the top surface of the structural layer 23. Vertical sections of the self-supporting etching mask material 25 will remain in place, although they may also be thinned in the dry etching process.

The regions 27 which are now unprotected on the first horizontal face of the structural layer in the B-B cross-section are the regions from which the second etching mask 22 was removed, and from which the self-supporting etching mask material 25 was subsequently also removed. On the other hand, in the A-A cross-section, the etch-control areas 212 defined by the first etching mask still remain on regions 28 of the structural layer, where the second etching mask was removed and where the self-supporting etching mask was subsequently deposited and removed. As the second deep etch proceeds, these etch-control areas will form bridge structures suspended between the self-supporting walls formed by the self-supporting etching mask 25.

Process step (e1) illustrates the A-A and B-B cross-sections in the beginning of the second deep etching step, where second vertical trenches 29 are etched by isotropic etching in the recess areas. The second vertical trenches 29 will first begin to form in the completely unprotected regions 27, while the etch-control areas 212 will stall the formation of second vertical trenches in regions 28. Process step (e2) illustrates the A-A and B-B cross-sections in when the second deep etching step has proceeded further. The isotropic etch has now undercut the bridges formed by etch-control areas 212, and the second vertical trenches 29 have thereby recessed the micromechanical structures across the entire recess area which was initially defined by the second etching mask 22.

The technical significance of the process steps illustrated in steps (e1) and (e2) in FIGS. 2c and 2d is that the speed by which the isotropic second deep etch recesses the micromechanical structures 26 depends on the width (W) and spacing (S) of etch-control areas 212 in the y-direction. The vertical etch rate of a micromechanical structure with a given width in the x-direction can thereby be changed by selecting the widths W and spacings S suitably.

Figure 3A:
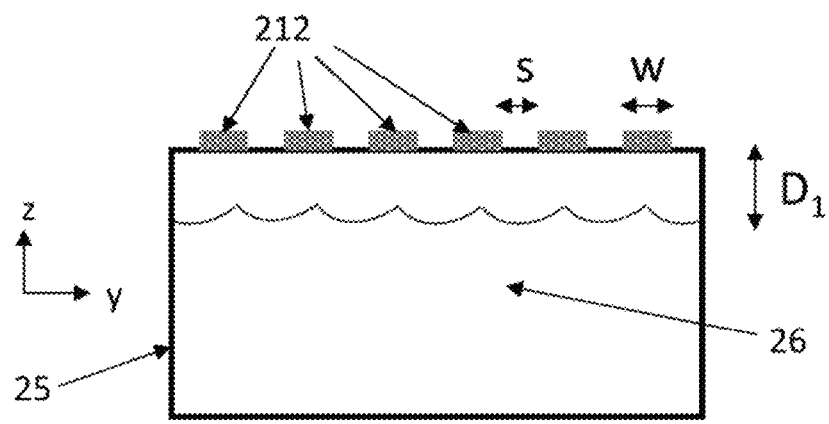
FIGS. 3a-3c illustrate different bridge geometries.
Figure 3B:
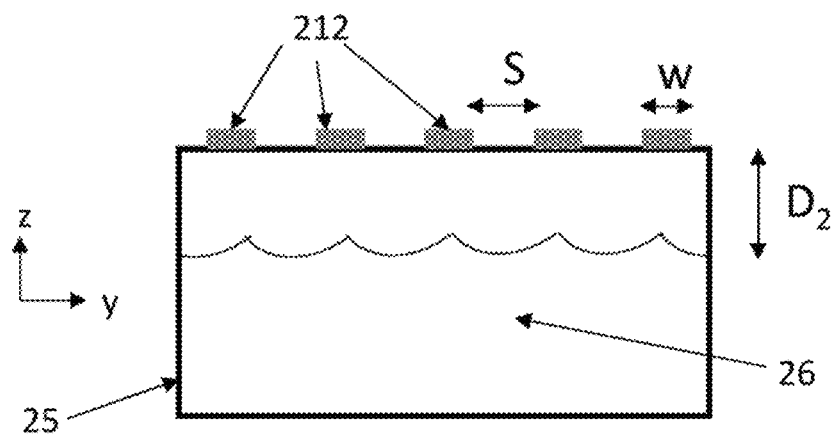
Figure 3C:
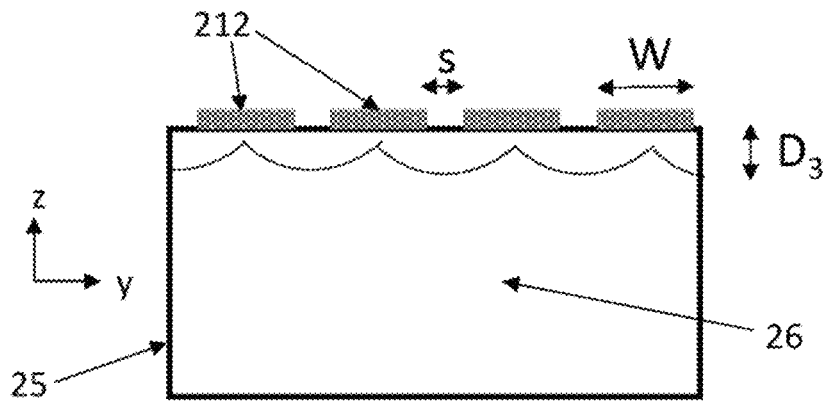

FIGS. 3a-3c illustrate a vertical cross section of the structural layer along the line C-C in FIGS. 2a-2b after the self-supporting mask material 25 has been deposited. The wall formed by the self-supporting mask 25, which supports the bridges formed by the etch-control areas 212, is illustrated as a black rectangle. The micromechanical structure 26 which is recessed in the etching process is for illustration purposes visible through the wall 25.

Narrow Recess Areas

The recess areas may define micromechanical structures with relatively high aspect ratios in the xy-plane, such as the long and narrow finger electrodes defined by the second etching mask 22 in FIG. 2b. If the recess areas defined by the second etching mask are sufficiently narrow, the etch-control areas (for example 212 in FIG. 2a) may comprise bridges which extend across the recess area.

Ain other words, all etch-control areas within the at least one recess area may comprise a set of parallel bridges which cross the recess area, from one side of said recess area to another side of said recess area.

All etch-control areas within each recess area may have the same size and shape and may be placed to extend across the recess area at regular intervals. If the shape of the etch-control areas is rectangular in the xy-plane, the etch-control areas may form a striped pattern across the recess area. The recess areas can also be given any other shape.

In other words, all bridges in the at least one recess area may have the same lateral bridge width. All bridges in the at least one recess area may be separated from adjacent bridges in the at least one recess area by a bridge gap.

In FIGS. 3a-3c, the bridges (which may also be called stripes) formed by the etch-control areas 212 of the first etching mask have equal width and are placed at equal intervals. FIG. 3a illustrates a situation where the width of each bridge has the relatively small value w, and the intervals between adjacent bridges have the relatively small value s. FIG. 3b illustrates a situation where the width of each bridge has the relatively small value w, and the intervals between adjacent bridges have the relatively large value S. FIG. 3c illustrates a situation where the width of each bridge has the relatively large value W, and the intervals between adjacent bridges have the relatively small value s. The etching process is isotropic.

After a given time the etching process has proceeded to the recess depth $D_1$ in FIG. 3a. In the same amount of time, the etching process has proceeded to the deeper recess depth $D_2$ in FIG. 3b. There are two reasons for this difference in the vertical etching rate. The first reason is that the etchant flux past the bridges is greater when the interval between them is greater. In FIG. 3a, where the intervals s are relatively small, the etchant flow which enters the unprotected parts of the recess area is smaller than in FIG. 3b, because the surface area of the regions that are not covered by etch-control areas 212 is smaller.

The second reason for the increased etching rate in FIG. 3b is that the required amount of horizontal etching is smaller when there are only five etch-control areas 212 on top (compared to six in FIG. 3a). This is even more clearly illustrated in FIG. 3c, where the vertical etching rate is smaller than in FIG. 3a, so that the recess depth is a smaller value $D_3$ after the same time has passed as in FIGS. 3a-3b. In FIG. 3c, the etch-control areas 212 have a large width W. This means that more etchant will be consumed for the horizontal undercutting of each bridge in FIG. 3c than in either of FIGS. 3a and 3b. When more etchant is consumed in horizontal undercutting, the vertical etching rate will be slower.

In other words, a larger interval S will produce a faster vertical etching rate. A larger width W will produce a lower vertical etching rate. These two variables (and consequently the number of etch-control areas 212 above one recessed micromechanical structure 26) can be independently varied an optimized.

The at least one recess area may comprise more than one recess areas, and the bridge gap in one of the at least one recess areas may be greater than the bridge gap in another of the at least one recess areas. Similarly, the lateral bridge width in one of the at least one recess areas may be greater than the lateral bridge width in another of the at least one recess areas. These two variables can be selected independently. Either one of them or both of them can be used to set a suitable vertical etching rate.

Figure 4:
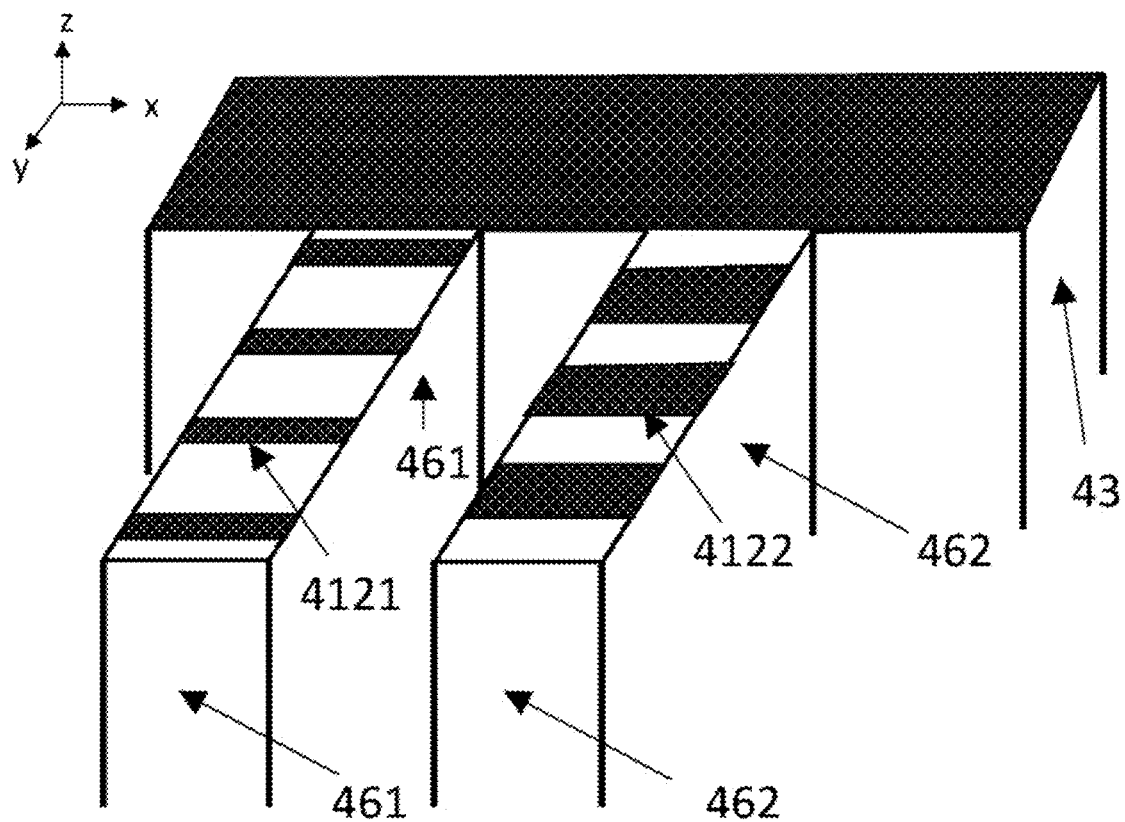
FIG. 4 illustrates two finger-shaped structures with different bridge geometries.

An exemplary arrangement is schematically illustrated in FIG. 4, which illustrates two finger electrodes in a structural layer after the first vertical trenches have been etched, but before the second deep etch has been started. The sidewalls of each finger electrode are protected by a self-supporting etching mask (not separately illustrated). Only the protruding structure 461 and 462 will be recessed. The structure 43 in the background will not be recessed since it is in this case fully covered by the first etching mask. As the second deep etch proceeds and the protruding structures 461 and 462 are recessed, the vertical sidewalls formed by self-supporting mask will remain standing and will support etch control areas 4121 and 4122, which form bridges across the recess area in the xy-plane.

In a first recess area, which defines the left-side finger 461, the width of the etch-control areas 4121 is narrow, and the intervals between them are wide. In a second recess area, which defines the right-side finger 462, the width of the etch-control areas 4122 is wide and the intervals between them are narrow. The vertical etching rate will be greater in the first recess area than in the second. Consequently, when the second deep etch is carried out for a certain duration, left-side finger 461 will be recessed to a greater recess depth than right-side finger 462.

In other words, the two micromechanical structures 461 and 462 can be recessed to different depths without having to define their respective areas with two separate masks, and without having to etch them in multiple second deep etching steps. Differences in the patterning of the etch-control areas on the first etching mask in the two recess areas can generate the desired difference in recess depths in only one recess etching step (which is called the second deep etch in this disclosure).

The general etching method steps discussed above with reference to FIGS. 2a-2d apply also to the situation illustrated in FIG. 4.

The recess depths in FIGS. 3a-3c may not necessarily be precisely constant along the length of the micromechanical structure 26. As indicated in these figures, successive peaks and troughs may be formed in the parts of the recess area which correspond to etch-control areas and open areas, respectively, on the horizontal face of the structural layer. As the second etch proceeds deeper, the height of the peaks may gradually be reduced (this effect has not been illustrated).

Figure 5:
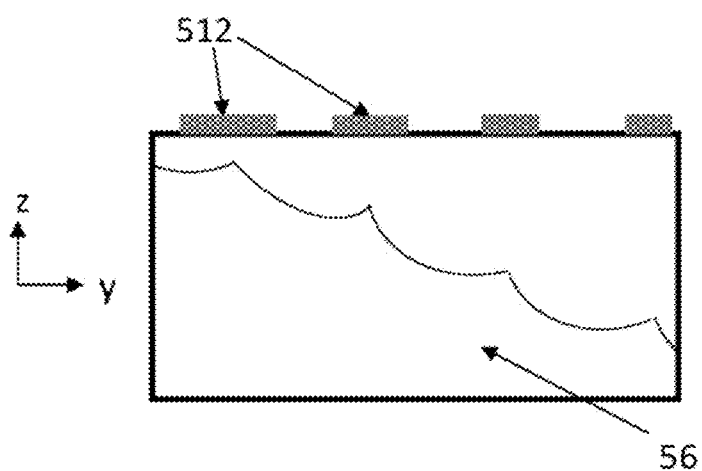
FIG. 5 illustrates the influence of bridge geometry on the vertical etching rate.

The widths W of the etch-control areas in one recess area and intervals S between them do not necessarily have to be equal. Etch-control areas of different widths can be used in the same recess area, and/or intervals between adjacent etch-control areas can differ within one recess area. FIG. 5 illustrates an example where the widths of etch-control areas 512 decreases along the y-axis, but the intervals between them increases. In this situation, the vertical etching rate will be faster on the right than on the left, and the recessed micromechanical structure 56 may obtain a sloping vertical shape.

The same principle can be applied in reverse if sloping vertical surfaces are to be avoided in recessed structured with varying widths, for example trapezoid-shaped structures. All etch-control areas within each recess area may still comprise a set of parallel bridges which cross the recess area.

The bridges within the at least one recess area may have at least two different lateral bridge widths, and the bridges may be positioned within the at least one recess area in order of increasing or decreasing bridge width. Alternatively, or complementarily, the bridges within the at least one recess area are separated from adjacent bridges by at least two different bridge gaps, and the gaps are positioned within the at least one recess area in order of increasing or decreasing bridge gap.

Figure 6A:
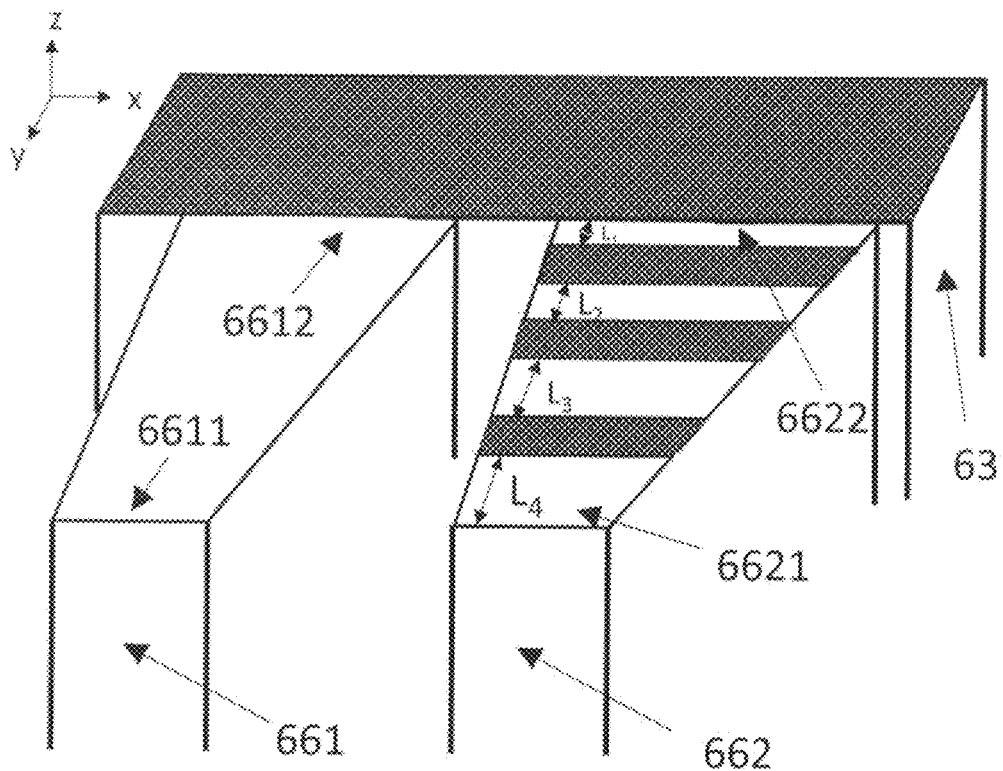
FIGS. 6a-6b illustrates etch-control areas on trapezoid-shaped structures.

FIG. 6a illustrates two trapezoid-shaped finger electrodes 661 and 662 in a structural layer after the first vertical trenches have been etched, but before the second deep etch has been started. The sidewalls of each finger electrode are again protected by a self-supporting etching mask, which has not been illustrated.

In a first recess area, which defines the left-side finger 661, no etch-control areas are present. When this finger is recessed by isotropic etching, the etch rate will usually be significantly faster near the base 6612 of the trapezoid than near its tip 6611. In this geometry, the vertical etch rate typically decreases as a function of distance from the base because the local etch rate depends on the local width of the finger in the x-direction. When the unprotected trapezoid finger 661 is recessed, the finger may therefore exhibit a vertical slope where recessed tip 6611 can lie significantly higher than the recessed base 6612.

This effect can be counteracted with suitably dimensioned and suitably placed etch-control areas. The right-side finger 662 comprises three etch-control areas. These areas are equally wide in the y-direction, but the bridge gaps $L_1$, $L_2$ between adjacent etch-control areas increases from the base 6622 of the trapezoid to its tip 6621, so that $L_1<L_2<L_3<L_4$, as illustrated in FIG. 6a. In other words, the gaps between adjacent bridges are positioned within the recess area in order of increasing bridge gap (from base to tip).

The bridge gaps can be selected so that the increase in etch rate due to a larger bridge gap compensates for the decrease in etch rate due to a smaller finger width. The vertical etch rate will then be constant across the entire trapezoid-shaped finger. In direct analogy to the previous examples, this effect can also be created by placing etch-control areas of different lateral bridge width at constant intervals from each other, for example in order decreasing width (from base to tip). This option has not been separately illustrated.

The two structures may also be combined, so that etch-control areas of different lateral bridge width are placed in a trapezoidal recess area in order of decreasing lateral bridge width (from base to tip), while the bridge gaps between these etch-control areas are placed in the same recess area in order of increasing bridge gap (from base to tip). This option is illustrated in FIG. 6b where bridges 611, 612 and 613 are placed on the recess area in order of increasing width, while the bridge gaps have been placed in order of decreasing width ($L_1<L_2<L_3<L_4$).

Figure 6B:
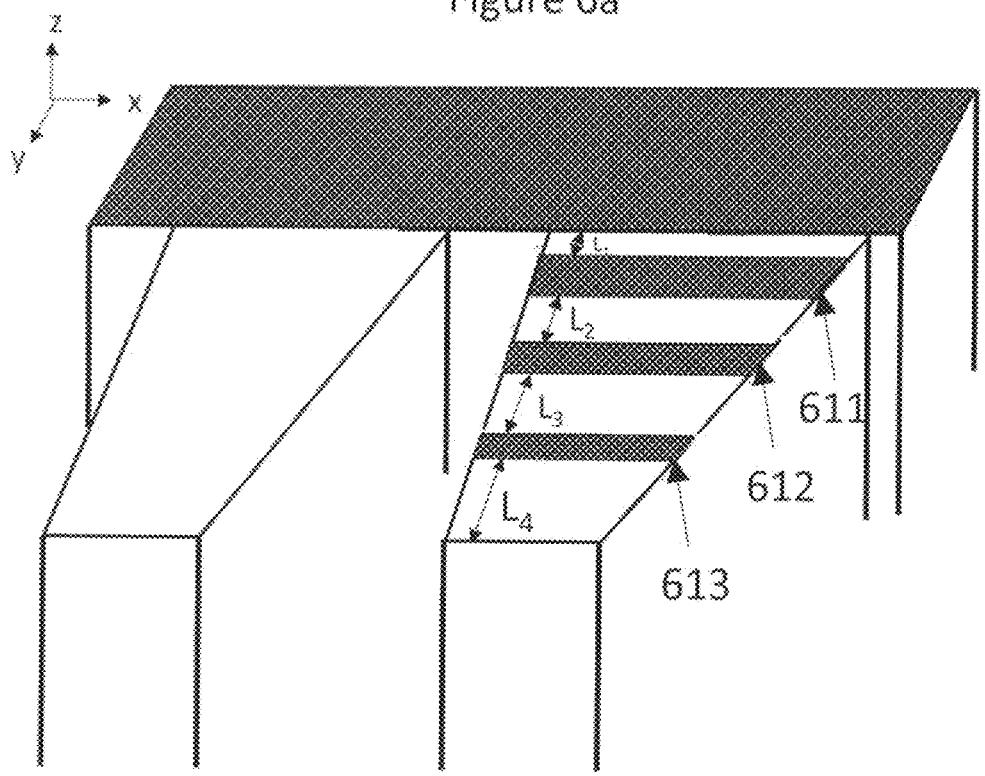

The general etching method steps discussed above with reference to FIGS. 2a-2d apply also to the situations illustrated in FIG. 6a-6b.

It is possible to use several second etching masks which define separate recess areas, and to remove a selected second etching mask before the next deep etch is performed in the selected recess area defined by the selected second etching mask. Different parts of the recess areas defined by any second etching mask can still be etched vertically at different by patterning the etch-control areas in the first etching mask in a suitable manner in these parts.

The self-supporting etching mask, which covers the vertical sidewalls in the first vertical trenches, facilitates the use of etch-control areas by providing the structural support that the bridges require. The self-supporting etching mask also brings other benefits to the second deep etch. For example, when the second deep etch is carried out on pre-existing high aspect ratio micromechanical structures which are to be recessed, further etching of high aspect ratio structures can create spikes on the upper edges of the recessed structure. Spikes can short-circuit and disturb electrical measurements in microelectromechanical structures, especially if they break. Spike formation can typically be avoided etching the recess aggressively (with a strong etchant), but this may damage the sidewalls. By protecting the sidewalls in the first vertical trenches with the self-supporting etching mask before the second vertical trenches are etched in the recess areas, damage can be avoided and the second deep etch can be carried out without spike formation.

Wide Recess Areas

The micromechanical structures which are to be recessed may alternatively have a relatively large area and small aspect ratio in the xy-plane. However, it is not always possible to implement bridges which extend across wide recess areas. It is therefore sometimes advantageous to employ etch-control areas with a different shape if the recess area is wide in all directions.

The etch-control areas within the at least one recess area may for example comprise a frame which extends inward from the edges of the recess area and has one open window within the frame.

Figure 7A:
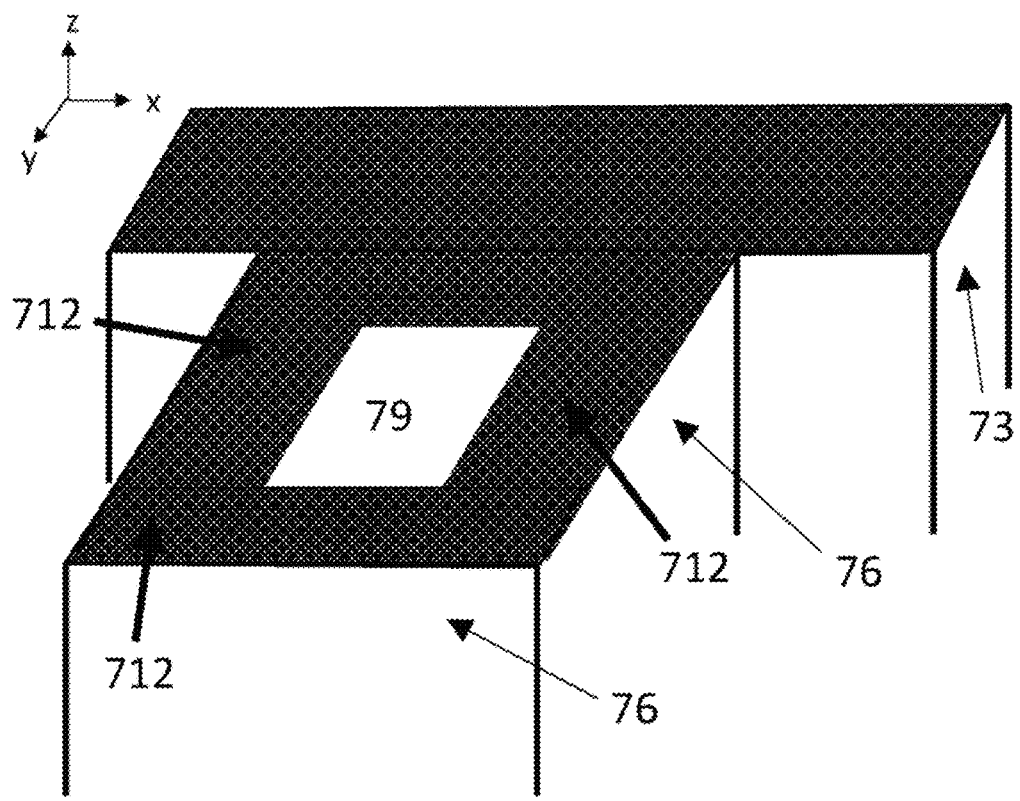
FIGS. 7a-7g illustrate etch-control areas on wide structures.

An exemplary arrangement is schematically illustrated in FIG. 7a, which illustrates one micromechanical structure 76 in a structural layer after the first vertical trenches have been etched, but before the second deep etch has been started. As in FIGS. 5 and 6a-6b, the recess area corresponds to the top surface of the protruding micromechanical structure 76 in the xy-plane. The sidewalls of the structure 76 is protected by a self-supporting etching mask (not separately illustrated). When the second deep etch is performed, the structure 76 will gradually be etched downward while the self-supporting etching mask remains standing where the sidewalls of the structure 76 once stood. Only the protruding structure 76 will be recessed. The vertical sidewalls formed by self-supporting mask will remain standing and will support etch control area 712, which forms a frame in the recess area in the xy-plane. The structure 73 in the background will not be recessed since it is fully covered by the first etching mask, as in the previous examples.

In the recess area illustrated in FIG. 4, the first etching mask forms an etch-control area 712 within the recess area. The etch-control area 712 forms a frame inside the recess area. In other words, the etch-control area 712 extends inward from the edges of the recess area and thereby extends from a part of the self-supporting mask which lies on one side of said recess area (for example, the left side of structure 76 in FIG. 7a) to a part of the self-supporting etching mask which lies on another side of said recess area (for example the right side). The etch-control area 712 defines an open window 79 within the frame.

When the second deep etch is performed, the etchant gains entry to micromechanical structure 76 through the open window 79 and recesses it in the vertical direction. The size of the window 79 determines the vertical etch rate. In other words, it is also possible to etch adjacent micromechanical structures to different recess depths in just one second deep etching step by patterning on them differently dimensioned etch-control areas.

When the second deep etch is performed, the frame-shaped etch-control area 712 will remain attached to the vertical walls formed by the self-supporting mask on the left side, the right side, and the side of the recess area which is closest to the viewer. On the side of the recess area where structure 76 is joined to the background structure 73, the first etching mask forms a continuous layer which extends onto the structure 73 which is not recessed. The etch-control area 712 thereby gains support from the structure 73 on the far side.

Figures 7B, 7C:
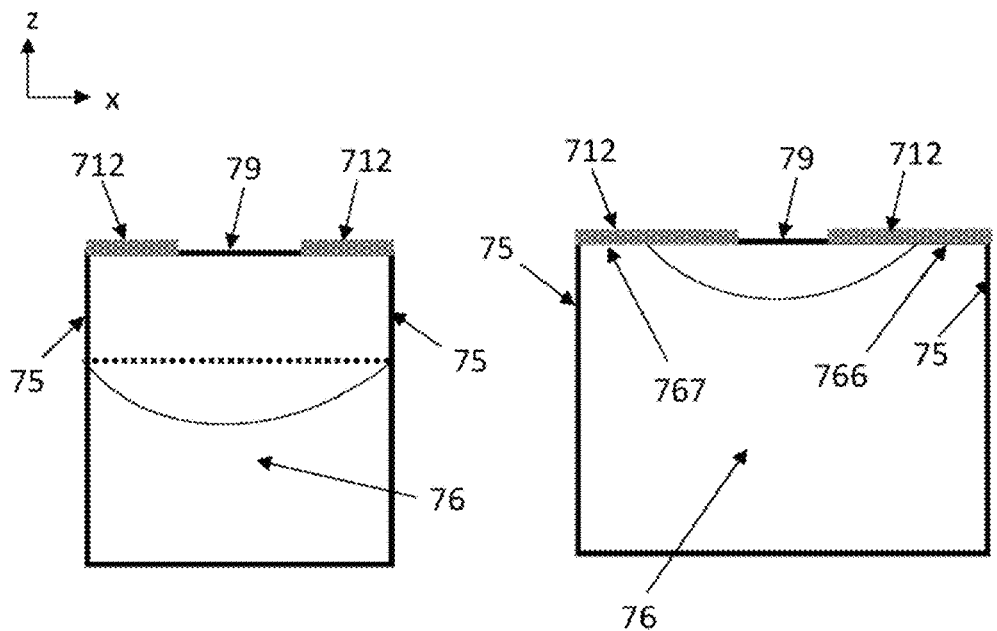

FIG. 7b illustrates an example of the vertical xz-cross-section of micromechanical structure 76 after the second deep etch has been conducted. The micromechanical structure has been recessed. vertical sidewalls 75 formed by the self-supporting mask remain standing, and they support the etch-control area 712, in this case on three sides. As in all other embodiments of this disclosure, the curvature of the top surface of micromechanical structure 76 has been drawn to scale.

FIG. 7c illustrates an alternative embodiment where the micromechanical structure 76 is not recessed along its entire width along the x-axis. Instead, the second deep etch only forms a dimple around the open window 79. Some level parts (766 and 767) still remain in the micromechanical structure. The sidewalls of the micromechanical structure 76 are still covered by the self-supporting mask 75, but the etch-control areas 712 gain their primary structural support from the level areas 766 and 767 where the micromechanical structure is not recessed.

The embodiment illustrated in FIG. 7c may, for example, be used to reduce the capacitance between the micromechanical structure 76 and a cap electrode located just above the open window 79, for example on the component package which overlies the micromechanical structure 76. The level areas 766 and 767 may be much larger than the dimples. Dimples can easily be created in the same second deep etch where fully recessed structures, such as the one illustrated in FIG. 7b, are produced. No extra masking and etching steps are needed.

Figure 7D:
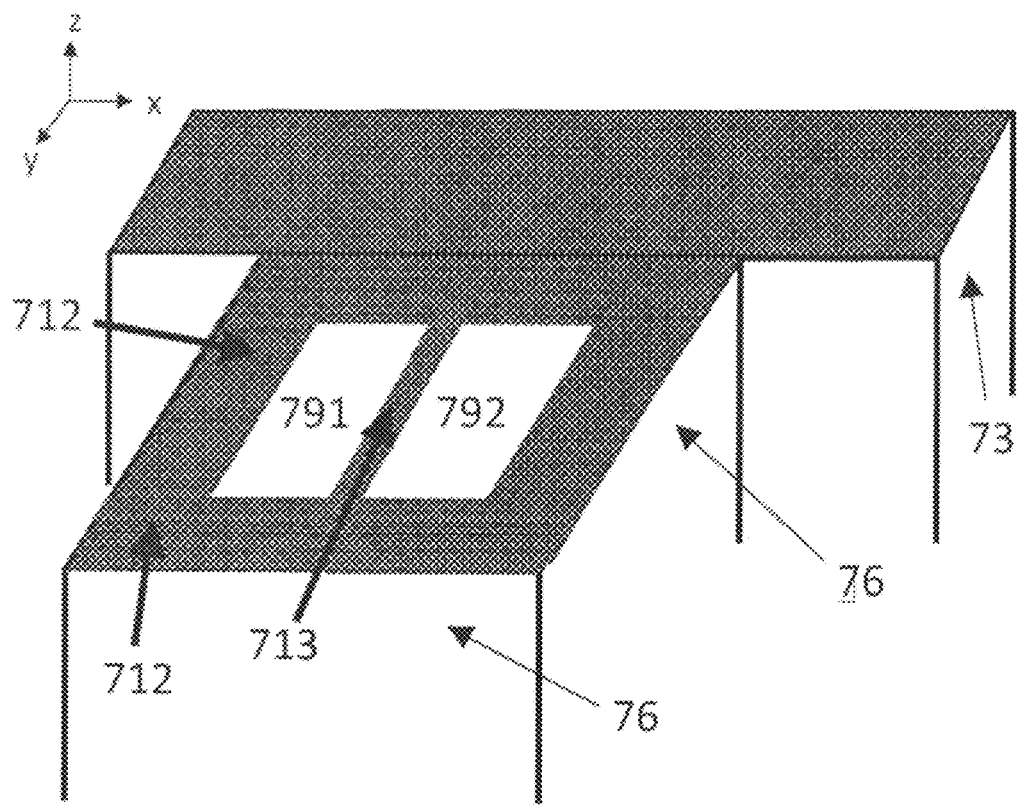

An alternative embodiment which combines frame-shaped and bridge-shaped etch-control areas is illustrated in FIG. 7d. In this case the etch-control areas within the at least one recess area comprise a frame which extends inward from the edges of the at least one recess area and one or more bridges which cross the frame, from one side of the frame to another side of the frame, so that a set of two or more open windows is defined within the frame.

In other words, the etch-control area illustrated in FIG. 7d comprises not only the frame 712 which was illustrated in FIG. 7a, but also a bridge 713 which extends across the frame so that two open windows 791 and 792 are formed within the recess area. The number of bridges may be N (where N is an integer greater than or equal to one), and the number of open windows is then N+1.

Everything which was said about bridge geometries and bridge gaps above applies also to this case. In other words, if multiple bridges 713 are utilized, then they may either all have the same lateral width or they may have different lateral width. The bridge gaps between them may all be the same, or they may be different. These parameters, together with the dimensions of the frame 712, will together determine the vertical etch rate in the recess area.

Figures 7E, 7F:
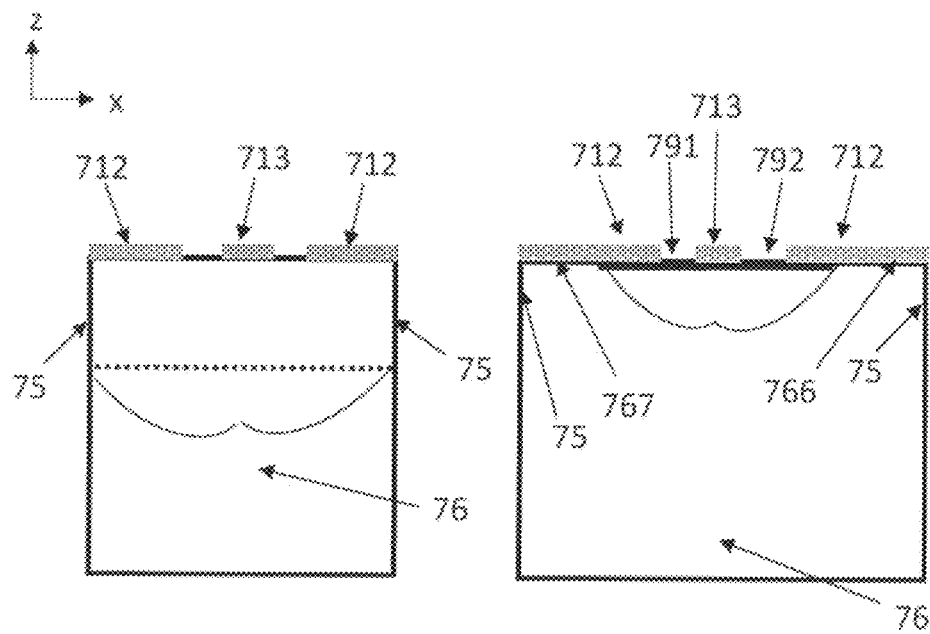

FIG. 7e illustrates an example of the vertical xz-cross-section of micromechanical structure 76 after the second deep etch has been conducted. The micromechanical structure has been recessed. vertical sidewalls 75 formed by the self-supporting mask remain standing, and they support the etch-control areas 712-713.

FIG. 7f illustrates an embodiment which is analogous to the one illustrated in FIG. 7c. The recess forms a pair of dimples around the open window 791 and 792, and the etch-control areas 712 gain their primary structural support from the level areas 767 and 768 where the micromechanical structure 76 is not recessed.

Figure 7G:
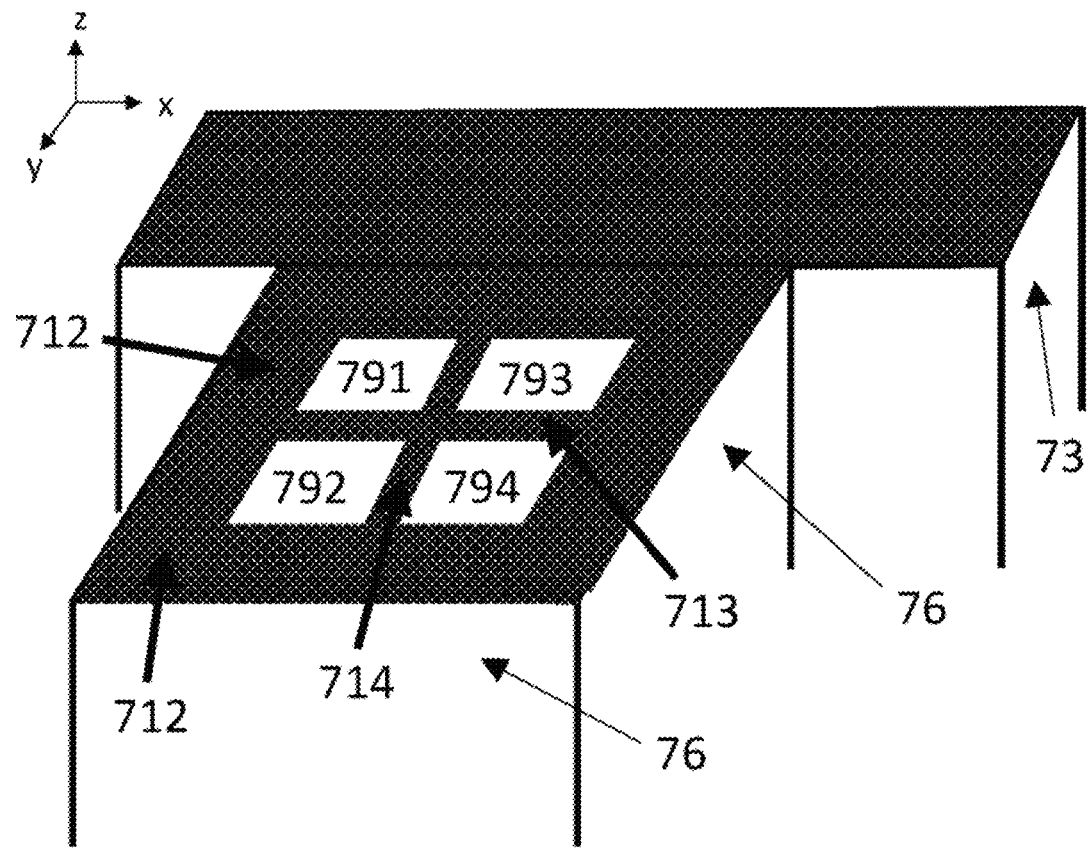

Another alternative embodiment which combines frame-shaped and bridge-shaped etch-control areas is illustrated in FIG. 7g. In this case the etch-control areas within the at least one recess area comprise a frame which extends inward from the edges of the at least one recess area and one or more first bridges which cross the frame in a first direction, and one or more second bridges which cross the frame in a second direction, different from the first direction, so that a set of four or more open windows is formed within the frame.

In other words, the etch-control area illustrated in FIG. 7g comprises not only the frame 712 which was illustrated in FIG. 7a, but also a first bridge 713 which extends across the frame in the transversal direction (parallel to the x-axis) and a second bridge 714 which extends across the frame in the lateral direction (parallel to the y-axis). Together, the etch-control area which comprises the frame 712, the first bridge 713 and the second bridge 714 thereby delimit four open windows 791-794 within the recess area.

The number and size of the open windows will depend on the size of the frame 712 and one the number and size of the first bridges 713 and the second bridges 714. The first bridges 713 and second bridges 714 need not necessarily be orthogonal to each other. Depending on the dimensions of the micromechanical structure, the second deep etch can either recess the entire micromechanical structure 76, as in FIG. 7*e*, or form dimples on the top surface of the micromechanical structure 76, as in FIG. 7*f*.

The principles presented above concerning bridge geometries and bridge gaps above apply also to this case. Bridge widths, bridge gaps and the dimensions of the frame 712 will together determine the vertical etch rate in the recess area.

The general etching principles discussed above with reference to FIGS. 2*a*-2*d* apply also to the situations illustrated in FIGS. 7*a*-7*g*.

The invention claimed is:

1. A method for manufacturing micromechanical structures in a structural layer of a wafer, wherein the manufactured structures include at least one recess area where the micromechanical structures are vertically recessed in relation to a horizontal face of the structural layer, the method comprising:
   a) depositing and patterning a first etching mask and a second etching mask on the horizontal face of the structural layer, wherein the first etching mask is deposited before the second etching mask, and the second etching mask defines at least one recess area which corresponds to at least one structure which is to be vertically recessed, and the first etching mask defines at least one etch-control area within the at least one recess area,
   b) etching first vertical trenches by anisotropic etching in regions of the structural layer which are not protected by the first etching mask or by the second etching mask,
   c) removing the second etching mask from the horizontal face of the structural layer, so that the at least one recess area, and the at least one etch-control area which extends across the at least one recess area, are exposed,
   d) depositing at least on the vertical sidewalls of the first vertical trenches a self-supporting etching mask, so that the vertical walls formed by the self-supporting etching mask follow the perimeter of the at least one recess area and the at least one etch-control area formed by the first etching mask covers a part of the at least one recess area by extending from a part of the self-supporting mask which lies on one side of said recess area to a part of the self-supporting etching mask which lies on another side of said recess area, and
   e) etching second vertical trenches by isotropic etching in the at least one recess area.

2. The method according to claim 1, wherein all etch-control areas within the at least one recess area comprise a set of parallel bridges which cross the recess area, from one side of said recess area to another side of said recess area.

3. The method according to claim 2, wherein all bridges in the at least one recess area have the same lateral bridge width and are separated from adjacent bridges in the at least one recess area by the same bridge gap.

4. The method according to claim 3, wherein the at least one recess area comprises more than one recess areas, and the bridge gap in one of the at least one recess areas is greater than the bridge gap in another of the at least one recess areas.

5. The method according to claim 3, wherein the at least one recess area comprises more than one recess areas, and the lateral bridge width in one of the at least one recess areas is greater than the lateral bridge width in another of the at least one recess areas.

6. The method according to claim 2, wherein the bridges within the at least one recess area have at least two different lateral bridge widths, and the bridges are positioned within the at least one recess area in order of increasing or decreasing bridge width.

7. The method according to claim 2, wherein the bridges within the at least one recess area are separated from adjacent bridges by at least two different bridge gaps, and the gaps are positioned within the at least one recess area in order of increasing or decreasing bridge gap.

8. The method according to claim 1, wherein the etch-control areas within the at least one recess area comprise a frame which extends inward from the edges of the at least one recess area and has one open window within the frame.

9. The method according to claim 1, wherein the etch-control areas within the at least one recess area comprise a frame which extends inward from the edges of the at least one recess area and one or more parallel bridges which cross the frame, from one side of the frame to another side of the frame, so that a set of two or more open windows is defined within the frame.

10. The method according to claim 1, wherein the etch-control areas within the at least one recess area comprise a frame which extends inward from the edges of the at least one recess area and one or more first bridges which cross the frame in a first direction, and one or more second bridges which cross the frame in a second direction, different from the first direction, so that a set of four or more open windows is formed within the frame.

* * * * *